US012061385B2

(12) United States Patent
Strauss et al.

(10) Patent No.: US 12,061,385 B2
(45) Date of Patent: Aug. 13, 2024

(54) THERMO-OPTIC LASER BEAM SHAPING WITH DOPED OPTICAL MATERIALS

(71) Applicants: CSIR, Brummeria (ZA); AEROSUD INNOVATION CENTRE (PTY) LTD, Centurion (ZA)

(72) Inventors: Hencharl Strauss, Pretoria (ZA); Darryl Naidoo, Pretoria (ZA)

(73) Assignee: The CSIR, Pretoria (ZA)

( * ) Notice: Subject to any disclaimer, the term of this patent is extended or adjusted under 35 U.S.C. 154(b) by 896 days.

(21) Appl. No.: 17/255,278

(22) PCT Filed: Jun. 26, 2019

(86) PCT No.: PCT/IB2019/055372
§ 371 (c)(1),
(2) Date: Dec. 22, 2020

(87) PCT Pub. No.: WO2020/003141
PCT Pub. Date: Jan. 2, 2020

(65) Prior Publication Data
US 2021/0263349 A1   Aug. 26, 2021

(30) Foreign Application Priority Data
Jun. 27, 2018 (ZA) .................. 2018/04308

(51) Int. Cl.
G02F 1/01 (2006.01)
H01S 5/00 (2006.01)

(52) U.S. Cl.
CPC ............ G02F 1/0147 (2013.01); H01S 5/005 (2013.01)

(58) Field of Classification Search
CPC ...... G02F 1/0147; G02F 1/293; G02F 1/0126; G02F 1/009; H01S 5/005
See application file for complete search history.

(56) References Cited

U.S. PATENT DOCUMENTS 6,462,883 B1 * 10/2002 Wang .................... G02B 27/09
                                                       359/641
6,766,075 B1 *  7/2004 King ................. H01S 3/094003
                                                       385/127

(Continued)

FOREIGN PATENT DOCUMENTS

EP      1011007      6/2000
WO   WO 97/30372    8/1997

OTHER PUBLICATIONS

International Search Report and Written Opinion for International (PCT) Patent Application No. PCT/IB2019/055372, dated Oct. 21, 2019, 11 pages.

Primary Examiner — George G. King
Assistant Examiner — Anna Smith
(74) Attorney, Agent, or Firm — Sheridan Ross P.C.

(57) ABSTRACT

A laser beam shaping system includes at least one doped medium which is doped with a dopant and which is optically transparent at the first wavelength range and a beam input or coupling configured to generate or receive a shaped beam that is required to be shaped, the shaped beam being at a first wavelength range and directed towards the doped medium. The system includes an absorbed beam input or coupling configured to generate or receive at least one absorbed beam at a second wavelength range which is different from the first wavelength range and which is directed towards the doped medium. The doped medium has a higher beam absorption characteristic at the second wavelength range than at the first wavelength range, causing the absorbed beam to have a higher absorption than the shaped beam in the doped medium. The doped medium has a coating which allows high transmission of both the first and the second wavelength ranges.

19 Claims, 8 Drawing Sheets

(56) References Cited

U.S. PATENT DOCUMENTS

| | | | |
|---|---|---|---|
| 2002/0025096 A1* | 2/2002 | Wang | G02B 19/0028 |
| | | | 385/8 |
| 2005/0248844 A1 | 11/2005 | Ueno et al. | |
| 2007/0104417 A1 | 5/2007 | Tanaka et al. | |
| 2010/0245960 A1 | 9/2010 | Ueno et al. | |
| 2013/0057945 A1 | 3/2013 | Ueno et al. | |
| 2017/0271837 A1* | 9/2017 | Hemenway | H01S 3/1001 |
| 2023/0258965 A1* | 8/2023 | Wang | G02F 1/0147 |
| | | | 385/37 |
| 2023/0309407 A1* | 9/2023 | Fujikane | G01J 5/22 |

* cited by examiner

THERMO-OPTIC LASER BEAM SHAPING WITH DOPED OPTICAL MATERIALS

CROSS REFERENCE TO RELATED APPLICATIONS

This application is a national stage application under 35 U.S.C. 371 and claims the benefit of PCT Application No. PCT/IB2019/055372 having an international filing date of 26 Jun. 2019, which designated the United States, which PCT application claimed the benefit of South Africa Application No. 2018/04308 filed 27 Jun. 2018, the disclosure of each of which are incorporated herein by reference.

FIELD OF INVENTION

This invention relates broadly to optics and to thermal characteristics of optical elements, and specifically to beam-shaping of coherent laser beams (e.g., low and high power) by utilising thermo-optical characteristics.

BACKGROUND OF INVENTION

Thermal lensing is well known in the optics industry (see, for example, https.//www.rp-photonics.com/thermal_lensing.html, accessed 8 Sep. 2017) and is generally perceived to be a problem which must be avoided or overcome. In broad terms, thermal lensing refers to a (mostly) quadratic phase change profile inside transmissive optical elements (like optical windows) which is caused by a similarly shaped temperature profile. In many elements this due to the absorption of a laser beam which is then partially converted to heat. This problem is exacerbated in high-powered laser systems. In extreme cases unwanted thermal lensing can also change the beam profile/shape of a beam, which in combination with a change in beam size leads to an uncontrolled variation in the energy density parameters, which can be detrimental to a multitude of laser applications.

However, in laser enabled applications requiring high power laser systems (such as selective laser melting systems, welding, marking, directed energy systems etc.), changing the beam shape in a controlled manner may be of great value since it may result in better performance or enable new capabilities for laser systems. However, there are limited optical beam shapers that can reliably shape very high-power laser beams. Most are power limited, expensive, can only shape single mode systems or are fixed elements that cannot be easily adjusted once manufactured. Such beam-shapers are deformable mirrors, diffractive optical elements, freeform optics, etc.

The Applicant proposes a method to controllably change the shape of a transmitted laser beam that is relatively cheap, easily adjustable and has no inherent power damage limits. The Applicant wishes to use the broader concept of thermo-optic phase change profiles, of which thermal lensing is but one example, in an intentional manner to transform, control or realise a thermo-optic phase transformation profile inside a specially doped and coated medium to control the phase of a transmitted laser beam, thereby manipulating its shape, either at all distances after the optical medium, or in a range of distances after the optical medium.

SUMMARY OF INVENTION

Accordingly, the invention provides a laser beam shaping system which includes:
- at least one optically transparent medium which is doped with a dopant (the doped medium);
- a beam input or coupling configured to generate or receive a shaped beam that is required to be shaped, the shaped beam being at a first wavelength and directed towards the doped medium;
- an absorbed beam input or coupling configured to generate or receive at least one beam at a second wavelength which is different from the first wavelength and which is directed towards the doped medium,
- wherein the doped medium has a higher beam absorption characteristic at the second wavelength than at the first wavelength, causing the absorbed beam to have a higher absorption than the shaped beam in the doped medium,
- and wherein the doped medium has a coating which allows high transmission of both the first and the second wavelengths.

The absorbed beam input(s) have specifically designed/calculated beam profiles/shapes to cause a specific transformation of the phase of the shaped beam after the optical element so as to change the beam profile/shape of the shaped beam input.

The term "shaped beam" may refer to the beam, whether it is before, inside, or after the doped medium.

The shaped beam input may be from any laser source/system that requires its beam to be shaped, such as that from fibre lasers, diode pumped solid state lasers, diode lasers, etc.

The shaped beam input may be a high power beam, in the order of watts, kilowatts or more. The shaped beam input may be used in laser material processing applications like additive manufacturing, laser cladding, laser welding, laser cutting etc., for directed energy applications as well as for high power communications and LIDAR applications etc. The laser resonator may have >1 W average output.

Alternatively, the shaped beam input may be a high peak power laser such as Q-switched, mode locked or femtosecond lasers etc., e.g., having >1 kW peak output.

Alternatively, the shaped beam input may be a high energy laser such as Q-switched, mode locked, gain switched, cavity dumped laser, etc., e.g., having a >1 mJ output.

The absorbed beam input(s) may be from a low cost laser(s) that is(are) able to deliver variable average powers, such as diode laser(s), delivery fibre-coupled diode laser(s) or other homogenised diode laser(s).

The absorbed beam input may be provided parallel to the transmitted shaped beam. The absorbed beam input may also be provided with an angular offset (i.e., not parallel) to the transmitted shaped beam.

The laser shaping system may include a beam guiding component to guide the shaped beam input and/or the absorbed beam input. The beam guiding component may be a dichroic mirror or beam-splitter. The guiding component may reflect the absorbed beams while transmitting the shaped beams or alternatively it can transmit the absorbed beams while reflecting the shaped beams.

The absorption of at least one of the absorbed beams is converted to heat and will cause a temperature gradient within the doped medium. The temperature profile inside the material induces a refractive index profile variation whose magnitude is primarily dependent on the thermo-optical coefficient or coefficients (dn/dT) of the material. This may result in the formation of an optical phase change profile within the doped medium.

In general the thermo-optical phase change profile inside the non-gain doped medium or media may modify or transform the shaped beam after it. The term "modify" the shaped beam implies changing or transforming its shape at either all distances or a range of distances after the doped medium in a controlled manner. The beam size of the beam might also be changed.

The type or extent of the thermo-optical phase change profile in a doped optical medium, induced by the pump absorbed beam(s), may depend on:
  absolute size and intensity of the absorbed beam(s) and the shaped beam input to be shaped;
  relative intensity of the absorbed beam(s) and the shaped beam input to be shaped;
  cooling/heating arrangement of the doped medium;
  relative size of the absorbed beam(s) and the shaped beam input to be shaped to each other and relative to the cooling/heating surfaces of the doped optical medium;
  position of the absorbed and shaped beam input to be shaped relative to each other and relative to the cooling/heating surfaces of the doped optical medium;
  intensity profile of the absorbed beam(s); and
  type of doped optical medium (especially its do/dT coefficient).

The shaped beam input may be higher power, even an order of magnitude or more, than the absorbed beam input(s). An advantage of this may be that a relatively low power, low cost absorbed beam input(s) (such as from diode lasers) may be used to shape the beam profile of a relatively high power, shaped beam input.

The doped medium may be a crystalline medium or a glass.

The doped medium may have a positive thermo-optical coefficient or coefficients (dn/dT). Such a doped medium may be doped silicate glass, Vanadate ($VO_4$) or Yttrium Aluminium Garnet (YAG) etc.

The doped medium may have a negative thermo-optical coefficient or coefficients (dn/dT). Such a doped medium may comprise doped Yttrium Lithium Flouride (YLF) or Calcium Flouride ($CaF_2$), etc.

Both types of media may be doped with Nd, Yb, Tm, Er, etc. referred to as the dopant. The function of the dopant is to selectively absorb only the absorbed beam inputs in a selected wavelength range.

Optical materials commonly used as base materials for laser gain materials (e.g., a crystalline or glass gain mediums) may be used as the medium.

It will be noted that in the present configuration, the doped medium may not significantly contribute to gain at either the first or second wavelengths of either the absorbed or shaped beams. While the dopants listed as examples are traditionally used as gain media, they do not necessarily fulfil this function for this present invention. The dopant may be merely to assist absorption and a resultant controlled heated zone within an optical material(s) that is transparent to the wavelength range of the transmitted shaped beam. For example, the transmitted shaped beam (as a result of an influence of the heated optical medium acting on the shaped beam input) may have a wavelength of 1 μm and the absorbed beam input may have a wavelength of 792 nm. The dopant may be Th (thulium) and the material may be YLF. Materials which are not traditional laser gain dopants may also be used. For example, such materials can be designed to optimally absorb low cost diode light, have very low absorption at shaped beam laser wavelengths and to have high thermal conductivity.

The doped medium may not amplify or absorb the shaped beam input. This may mean that 99.9%, alternatively, 99%, alternatively 95%, and alternatively 90%, of the shaped beam input is not amplified or absorbed. There may be minor losses of the shaped beam input which, for the purposes of this specification, does not constitute absorbance. However, at least one absorbed beam input is at least partially absorbed.

It will be noted that in the present configuration, an undoped medium may not significantly absorb the first or second wavelength ranges of the resonating or absorbed beams. This may mean that 99.9%, alternatively, 99%, alternatively 95% of the resonating or absorbed beam(s) is not absorbed in an undoped medium.

To reduce losses, the doped medium may be coated with a layer of material that causes the doped medium to be Anti-Reflective (AR) for which the reflective losses may be reduced primarily for the shaped beam wavelength range, and to a lesser extend for the absorbed beam wavelength range. This may mean that 99.9%, alternatively, 99%, alternatively 95%, and alternatively 90%, of the shaped and absorbed beam inputs are not reflected by the surfaces of doped medium(s).

The doped medium may also be uncoated but Brewster cut to reduce losses to polarised shaped beams.

If the rate of change of phase transformation is important on a shaped beam input, then a doped medium/media having a high thermal conductivity may be selected.

An efficient and effective doped medium may have the following properties:
  High optical transmission and very little absorption and/or gain of the shaped beam input;
  Controllable absorption of the absorbed beam input via the doping concentration;
  A high percentage of conversion of the absorbed beam input optical energy to thermal energy;
  A high thermal conductivity;
  Low reflective losses of the shaped and absorbed beams;
  High damage thresholds to accommodate very high power/energy transmitted shaped beam inputs; and
  A high thermo-optical coefficient(s) (dn/dT).

All of these properties together may define a new class of optical material (thermo-optical shaping materials) which is different from conventional laser gain materials. Such materials need to be specially manufactured and are not yet commercially available as stock items.

As an example, if we consider two absorbed beam inputs that are both uniformly circular in shape (circular flat-tops) that are positioned at some equidistant position away from the centre of the medium towards the boundary of the medium, the phase transformation may be that of a cylindrical lens and the resulting effect on a smaller circular shaped beam input as it transits the centre of the doped medium may transform it roughly to an elliptical beam (if the shaped beam does not intersect the absorbed beams).

As an example, if two absorbed beams are used with one small and intense one at the centre of the optical medium and the other a lower power less intense pedestal around it, a thermo optical phase transformation similar to an axicon is formed within the doped medium. Transmitted Gaussian (TEM00) shaped beams are transformed into Bessel Gauss beams after the doped medium.

If the absorbed beam input has a flat-top (or top hat) shape and the shaped beam is smaller than the extent of this flat-top absorbed beam input, the phase transformation may be spherically quadratic and the resulting effect on the shaped beam as it transits the doped medium may be that of a quadratic phase, spherical lens (if the shaped beam is significantly smaller than the absorbed beam). This transformation may not alter the shape of laser beams, will only spherically transform their radii of curvature and is therefore not considered as beam shaping.

For complete transformations, two phase change elements may be required. A laser shaping system with two or more elements is envisioned. It may consist of two or more doped materials positioned in series. The materials may have absorbed beam inputs in different wavelength ranges impinging on them. The wavelength range of one set of absorbed beam inputs is such that it is not significantly absorbed in at least one of doped materials, but is still in the second wavelength range such that it is reflected by the 45 degree beam guiding component. Alternatively a second 45 degree beam guiding component may be employed.

The laser shaping system may include a controller configured to control the absorbed beam input, thereby to control the absorbed beam. Alternatively, the laser shaping system may include a lookup table of pre-set values of power levels of the absorbed beam(s) inputs, thereby to control the absorbed beam(s). To the extent that the thermo-optical phase change profile is dependent on the absorbed beam(s), the thermo-optical phase change profile may be adjusted or controlled by adjusting or controlling the absorbed beam input.

BRIEF DESCRIPTION OF DRAWINGS

The invention will now be further described, by way of example, with reference to the accompanying diagrammatic illustrations.

In the drawings.

DETAILED DESCRIPTION OF EXAMPLE EMBODIMENT

The following description of the invention is provided as an enabling teaching of the invention. Those skilled in the relevant art will recognise that many changes can be made to the embodiment described, while still attaining the beneficial results of the present invention. It will also be apparent that some of the desired benefits of the present invention can be attained by selecting some of the features of the present invention without utilising other features. Accordingly, those skilled in the art will recognise that modifications and adaptations to the present invention are possible and can even be desirable in certain circumstances, and are a part of the present invention. Thus, the following description is provided as illustrative of the principles of the present invention and not a limitation thereof.

Figure 1:
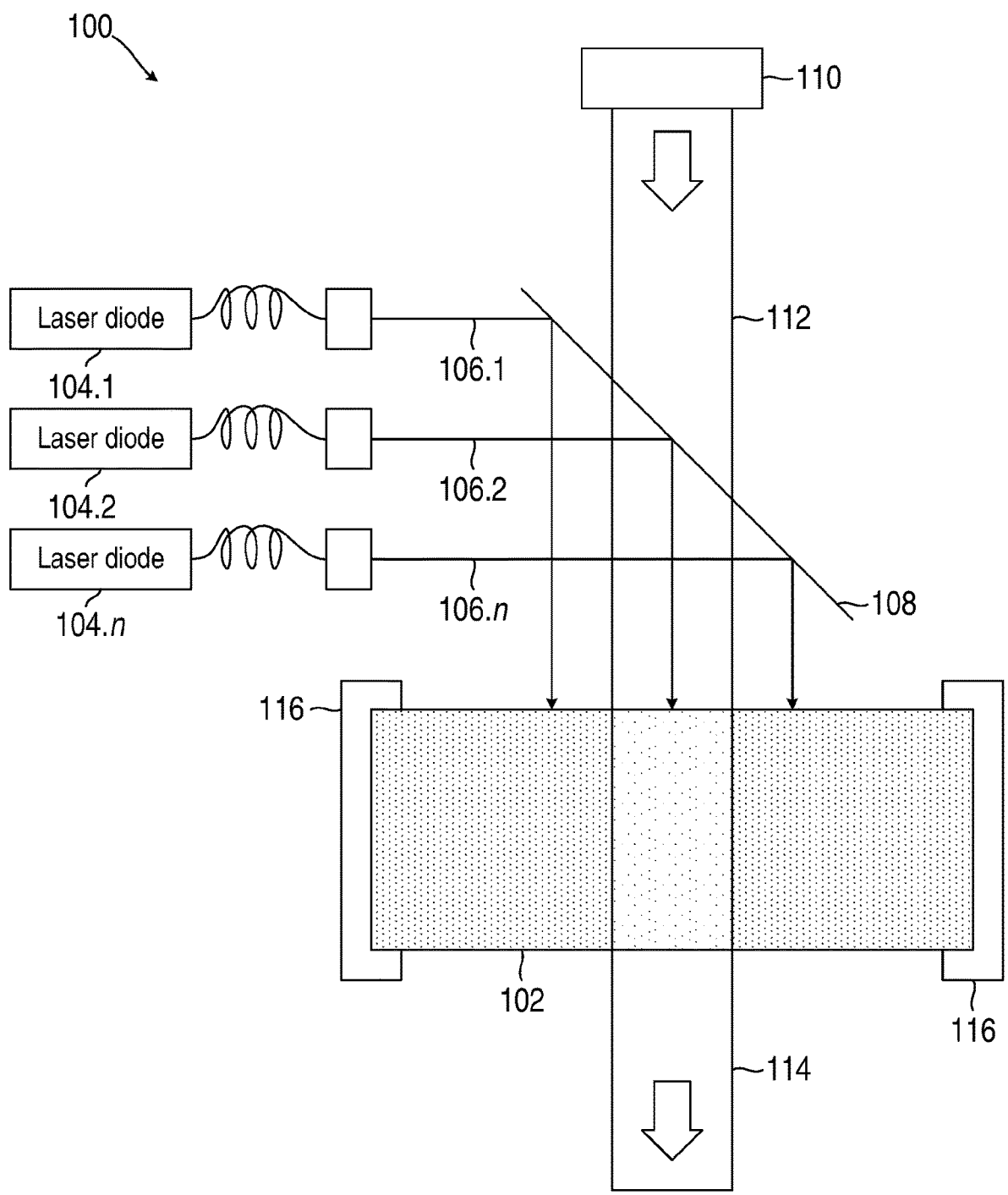
FIG. 1 shows a schematic side view of a first embodiment of a laser shaping system in accordance with the invention.

FIG. 1 illustrates a first embodiment of a laser shaping system 100 in accordance with the invention. The laser shaping system 100 has an optically transparent medium 102 which is doped with a dopant (hence referred to as the doped medium 102). The medium itself is a crystalline or glass medium but which is not operated as a gain medium—in other cases (in accordance with prior art techniques), the same type of crystalline or glass medium could be utilised as a gain medium in a conventional laser amplifier, with different anti-reflective coatings on the surfaces of the medium. In this example of the present invention, the doped medium 102 is optically transparent at a first wavelength range near 1 μm and at least partially optically absorptive at a second wavelength range near 792 nm. In this example, the absorptive properties are due to the presence of the dopant Thulium in the doped medium 102.

The laser shaping system 100 has a plurality of absorbed beam inputs 104.1, 104.2, 104.n (referred to collectively by numeral 104). The absorbed beam inputs 104 are configured to generate respective absorbed beams 106.1, 106.2, 106.n (referred to collectively by reference numeral 106) at the second wavelength. In this example, the absorbed beam inputs are simple laser diodes 104, which are relatively cheap, compact, and readily available. In this example, a laser beam generated by such laser diodes 104 has a wavelength of 792 nm.

The various absorbed beams 106 are parallel to one another. The laser shaping system 100 has a beam guiding component 108 in the form of a dichroic mirror arranged diagonally at 45° between the laser diodes 104 and the doped medium 102 to redirect the absorbed beams 106 by 90°.

In a different embodiment (not illustrated), the shaped beam 112 may be redirected by 90° and the absorbed beams may be transmitted.

The laser shaping system 100 has a shaped beam input 110 configured to generate or receive a shaped beam 112 at the first wavelength. The shaped beam input 110 directs the (input) shaped beam 112 towards the doped medium 102 and an output shaped beam 114 exits the doped medium 102 on the other side.

In one embodiment (not illustrated), the shaped beam input 110 may not itself generate the shaped beam 112 but may be a coupler to receive the shaped beam input 112 generated from an external laser generation device. In this example the shaped beam input 110 is a multi-kilowatt fibre laser collimator and the shaped beam 112 is a collimated multi-kilowatt laser beam.

In this example, the doped medium is coated with a layer of material that is Anti Reflective (AR) at wavelengths near 1 μm and Highly Transmissive (HT) at wavelengths near 792 nm.

Importantly, at least some optical energy from the absorbed beams 106 is absorbed by the doped medium 102 and converted to heat. This causes the doped medium 102 to heat up in the region of the absorbed beams 106 and thereby induces a thermo-optical phase change profile. The precise type of thermo-optical phase change profile may vary depending on a number of factors, including the composition of the medium, the dopant, the absorbed beam(s) 106, the shaped beam 112, the relative arrangement of the absorbed beams 106, cooling/heating configuration of the medium etc.

Heating or cooling elements 116 may be provided at or near the doped medium 102 (e.g., at sides of the doped medium 102) to provide additional heating or cooling characteristics.

Figure 2:
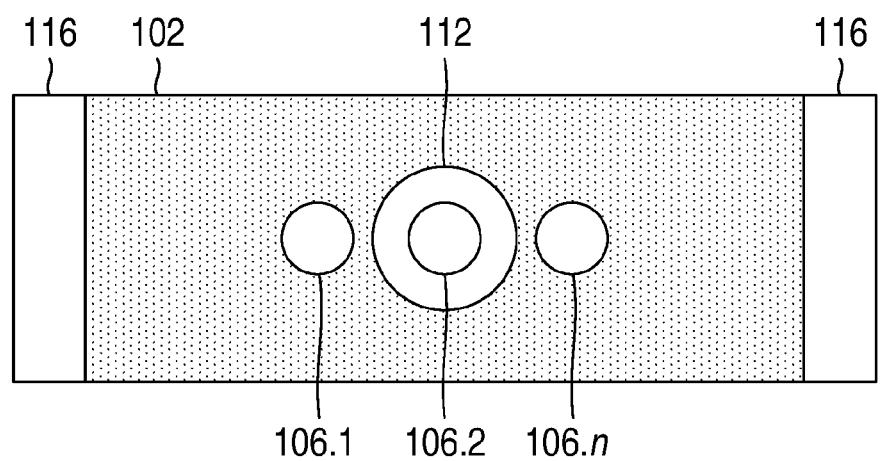
FIG. 2 shows a schematic front view of an example input beam configuration of the laser shaping system of FIG. 1.

FIG. 2 illustrates an input beam configuration of the absorbed beams 106 and the input shaped beam 112 provided by the laser shaping system 100. In this example, the absorbed beams 106 are arranged linearly and the input shaped beam 112 is arranged centrally.

Figure 3:
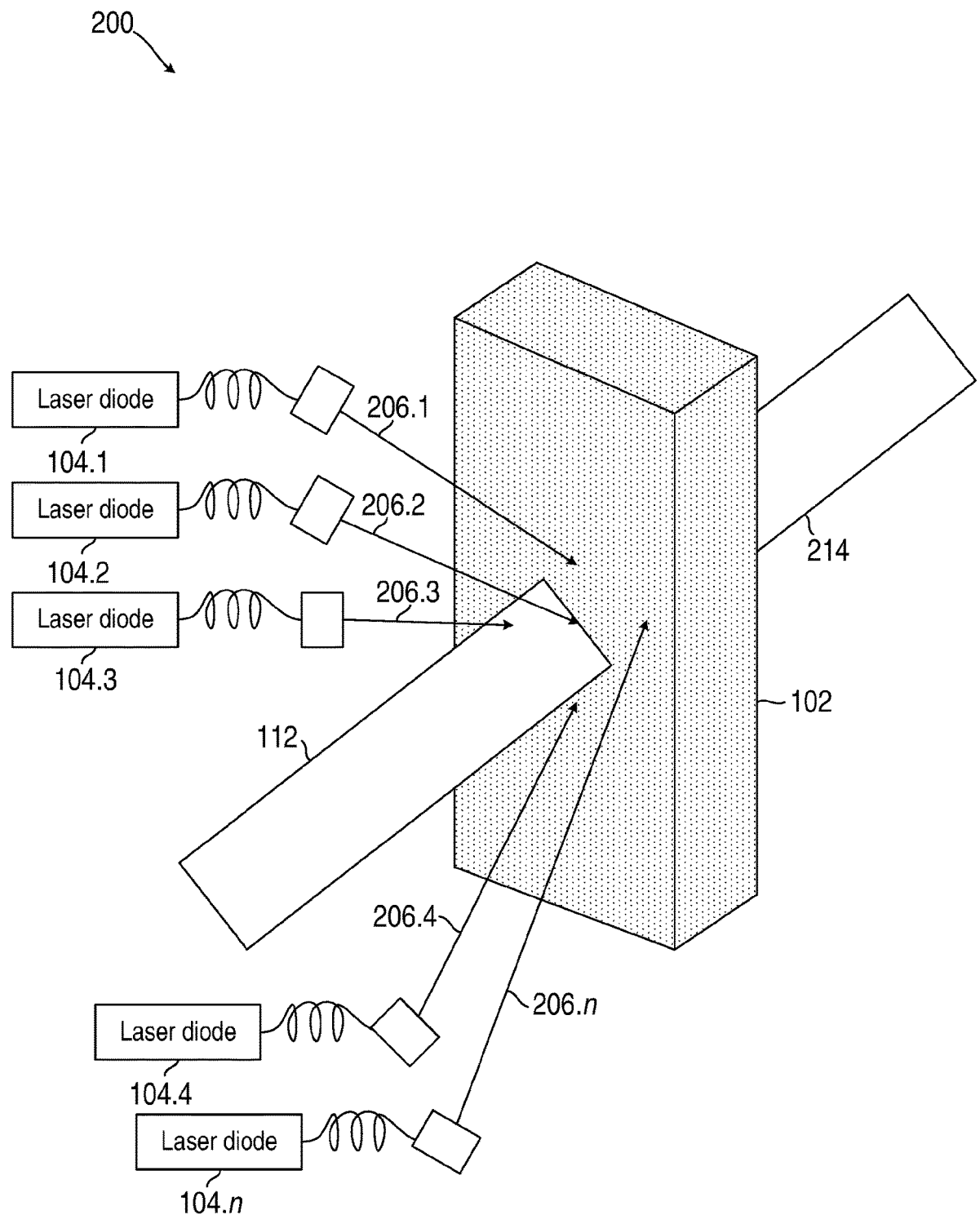
FIG. 3 shows a schematic three-dimensional view of part of a second embodiment of a laser shaping system in accordance with the invention including only a doped medium and absorption beams.

FIG. 3 illustrates a second embodiment of part of a laser shaping system 200 in accordance with the invention, showing only the doped medium and absorption beams (without the cooling or heating elements). The same numerals in different FIGS refer to the same or similar features. The laser shaping system 200 has five laser diodes 104 but instead of providing parallel absorbed beams, they provide converging absorbed beams 206 and thus dispense with the need for the dichroic mirror 108 of the laser shaping system 100 of FIG. 1. Here the shaped beam 112 is transformed into a shaped beam output 214 after transmission through the doped medium 102.

Figure 4:
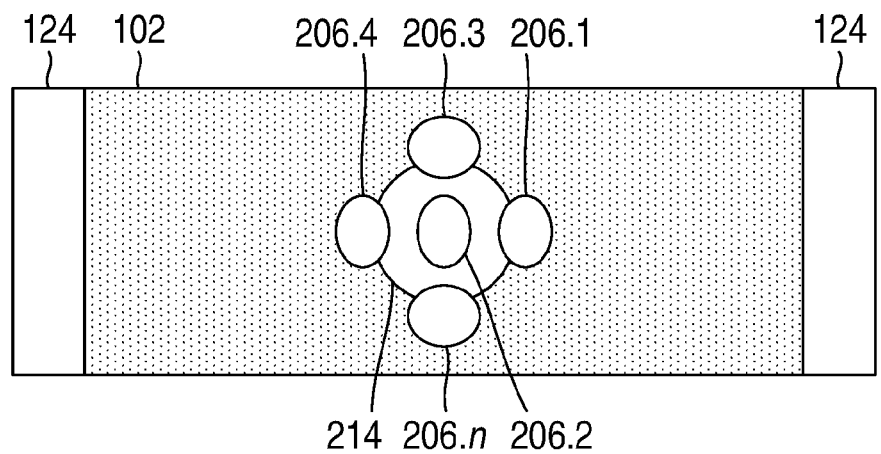
FIG. 4 shows a schematic front view of an example input beam configuration of the laser shaping system of FIG. 3.

FIG. 4 illustrates the arrangement of beams 214 provided by the laser shaping system 200. In this case, the absorbed beams 206 are arranged in a cross. It will be appreciated that FIGS. 2 and 4 illustrate but two of a large number of potential input beam arrangements, which may vary considerably based on design requirements and preferences.

Figure 7:
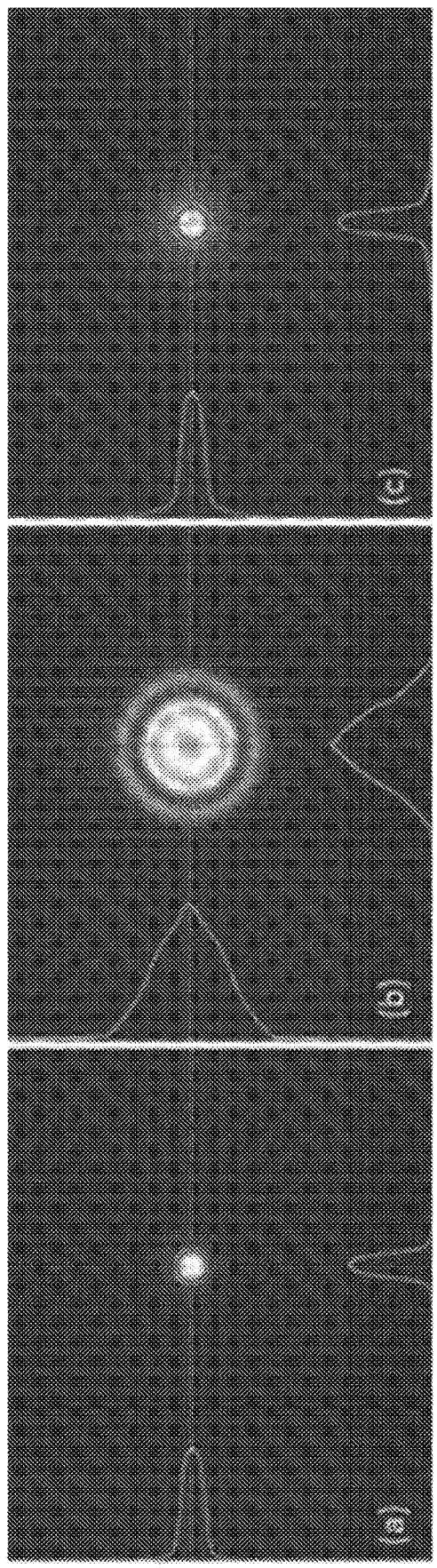
FIG. 7 shows an intensity graph of example beam intensities of the laser shaping system of FIG. 1.

FIG. 7 illustrates the intensity of two absorbed beams 206 at the face of the doped medium 102. One is small and intense at the centre of the optical medium (a) while the other is larger and less intense at the centre as compared to the first beam (b). Both beams have a similar shape but differ in size such that the combined absorbed beam intensity profile has a high peak intensity in the centre surrounded by a pedestal (c). A thermo optical phase transformation similar to an axicon is formed by the combined absorbed beam intensity within the doped medium.

Figure 8:
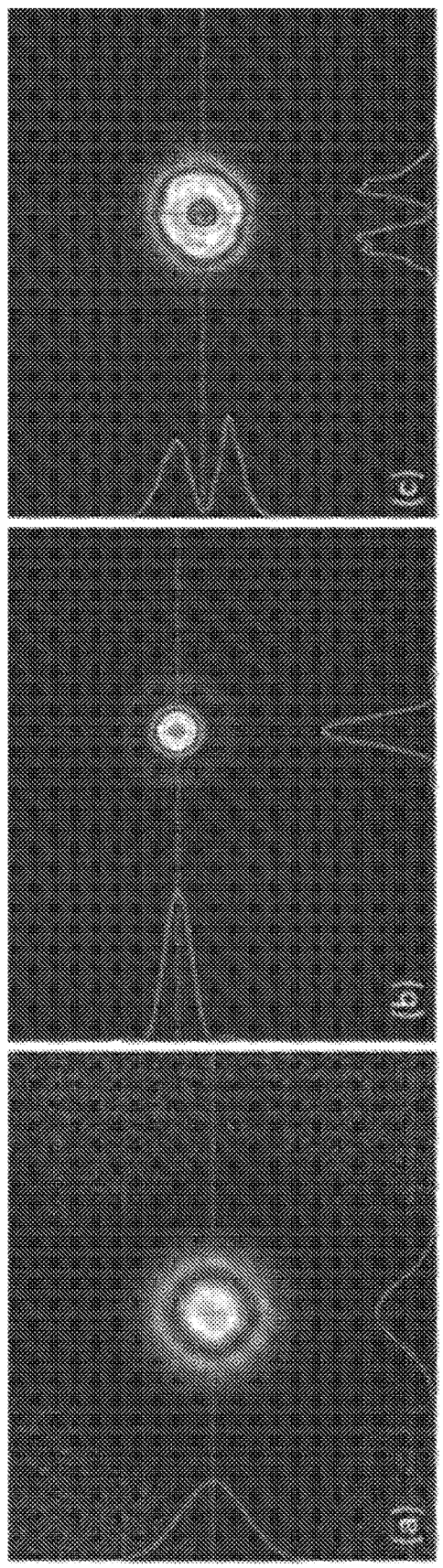
FIG. 8 shows an intensity graph of example beam intensities of the laser shaping system of FIG. 1.

FIG. 8 illustrates the transformation of a Gaussian shaped beam (112) shown in (a) by the absorbed pump arrangement shown in FIG. 7 to a Bessel beam (b) which has a characteristic ring structure around a central peak intensity in the near field (b) and an annular ring structure (c) in the far field.

An advantage of the laser shaping system 100, 200 is that relatively lower power absorbed beam(s) can be used to control a relatively higher power shaped beam.

An advantage is that the magnitude and distribution of the phase change profile can be changed by changing the amount of optical energy in the absorbed beam(s) (from the laser diodes 104. The result is the ability to easily vary the effect and/or the magnitude of the phase change element(s).

Figure 5:
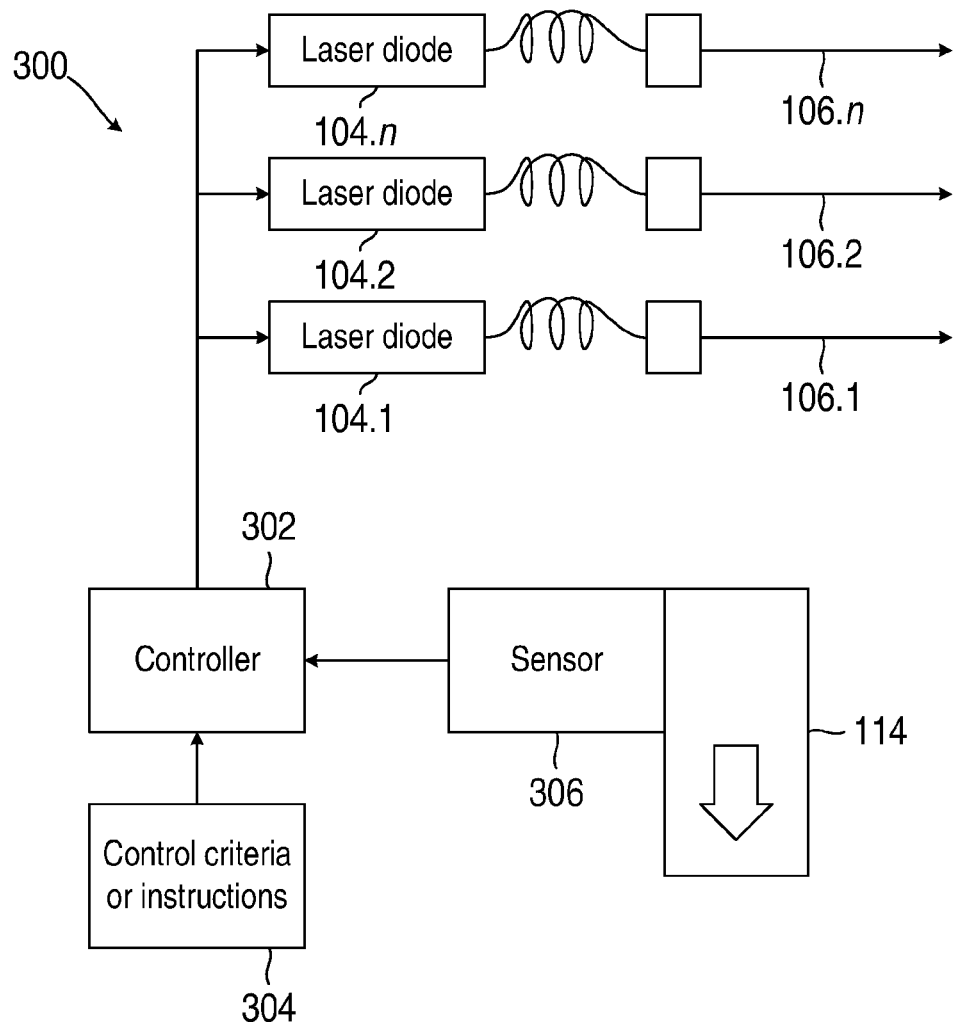
FIG. 5 illustrates a control system which may form part of the laser shaping system of FIG. 1 or 3.

Another advantage may be that the laser diodes 104 are easily electronically controllable. FIG. 5 illustrates a basic control system 300 which may form part of the laser shaping system 100, 200. An electronic controller 302 can control the laser diode 104 to vary characteristics of the absorbed beams 106, e.g., their intensity. The controller 302 comprises control criteria or instructions 304 and may be embodied by a computer. Optionally, the control system 300 also includes a sensor or detector 306 to sense a characteristic of the output shaped beam 114 or any other relevant sensor, thereby enabling the controller 302 to adjust the laser diode 104 according to a characteristic of the output shaped beam 114 or an effect of the output shaped beam—thus providing a feedback mechanism. This could be used to control or correct transient characteristics of the output shaped laser beam 114.

Figure 6:
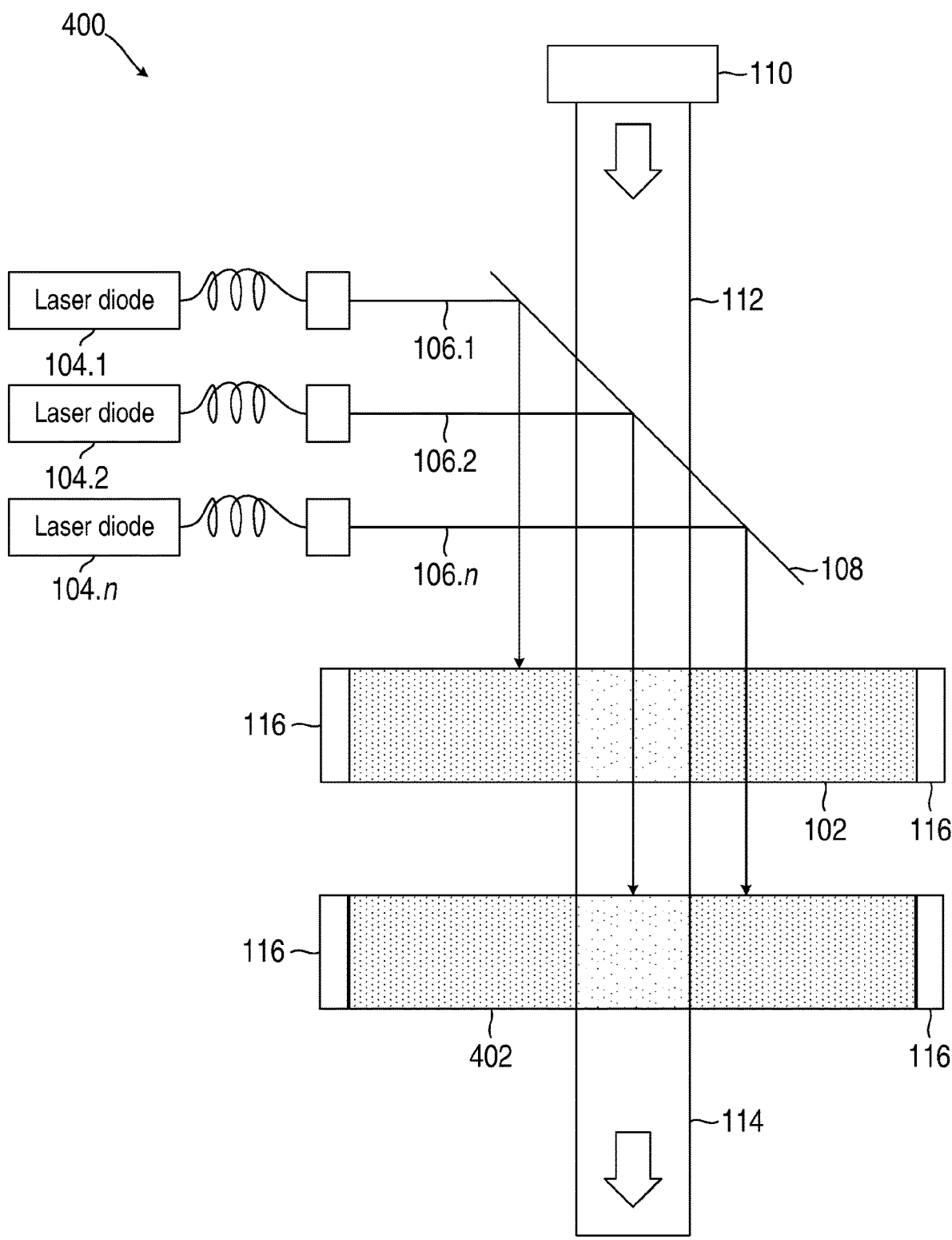
FIG. 6 shows a schematic side view of a third embodiment of a laser shaping system in accordance with the invention.

FIG. 6 illustrates a third embodiment of a laser shaping system 400 in accordance with this invention. The laser shaping system 100 has two sequential doped media 102, 402 which can be heated by different lasers diode 104. The doped media 102, 402 may therefore be absorptive at different wavelengths. In this example, the first doped medium 102 absorbs the light from the laser diode 104.1 and the second doped medium 402 absorbs the light from the other laser diodes 104.2, 104.n. This may allow for more complicated or complete beam transformations.

Both circular and rectangular symmetric transformations are possible. In most cases circular transformations may require a circular symmetric absorbed beam intensity profile, an isotropic doped medium as well as the central positioning of both the absorbed and shaped beam inputs with respect to equidistant cooling/heating edges of the doped material. Rectangular symmetric transformations may require either rectangular symmetric absorbed beam intensity profiles and/or non-isotropic materials.

The Applicant envisages that the inventive principle may enable a range of new products. These products would make use of variable positive and negative fixed variable beam shapers for high power lasers and systems. These could be used to transform laser beams into time varying shapes that result in more efficient laser material processing and directed energy laser systems.

It can be technically challenging to shape and/or to control high-power lasers beams (sometimes in the order of kW) due to their high power. The invention proposes use of a doped medium or mediums to shape and/or control selected characteristics of lasers (e.g., high power lasers, but the application is not limited thereto) using relatively lower power and cheap laser light.

What is claimed is:

1. A laser beam shaping system, comprising:
   at least one doped medium which is doped with a dopant and which is optically transparent at a first wavelength range;
   a beam input or coupling configured to generate or receive a shaped beam that is required to be shaped, the shaped beam being at the first wavelength range and directed towards the doped medium; and
   an absorbed beam input or coupling configured to generate or receive an absorbed beam at a second wavelength range which is different from the first wavelength range and which is directed towards the doped medium,
   wherein the doped medium has a higher beam absorption characteristic at the second wavelength range than at the first wavelength range, causing the absorbed beam to have a higher absorption than the shaped beam in the doped medium,
   wherein the doped medium has a coating which allows high transmission of both the first and the second wavelength ranges, and
   wherein the doped medium does not significantly contribute to gain at either the first and/or second wavelength ranges of either the absorbed or shaped beams.

2. The laser beam shaping system as claimed in claim 1, in which the absorbed beam has a beam profile or shape to cause a specific transformation of a phase of the shaped beam after the doped medium so as to change the beam profile or shape of the shaped beam.

3. The laser beam shaping system as claimed in claim 1, in which:
the shaped beam is a high power beam;
the shaped beam is a high peak power laser beam; or
the shaped beam is a high energy laser beam.

4. The laser beam shaping system as claimed in claim 1, in which the absorbed beam input or coupling is at least one of a laser diode, delivery fibre-coupled diode laser, or other homogenised diode laser.

5. The laser beam shaping system as claimed in claim 1, which is configured to provide the absorbed beam parallel to the shaped beam.

6. The laser beam shaping system as claimed in claim 1, which is configured to provide the absorbed beam with an angular offset (i.e., not parallel) to the shaped beam.

7. The laser beam shaping system as claimed in claim 1, which includes at least one beam guiding component to guide the shaped beam and/or the absorbed beam.

8. The laser beam shaping system as claimed in claim 1, in which the absorbed beam, when absorbed, is converted to heat and causes a temperature profile within the doped medium.

9. The laser beam shaping system as claimed in claim 8, in which the temperature profile inside the doped medium induces a refractive index profile variation whose magnitude is primarily dependent on a thermo-optical coefficient or coefficients (dn/dT) of the doped medium.

10. The laser beam shaping system as claimed in claim 9, in which the refractive index profile variation results in formation of an optical phase change profile within the doped medium.

11. The laser beam shaping system as claimed in claim 10, in which the optical phase change profile inside the doped medium modifies the shaped beam after it.

12. The laser beam shaping system as claimed in claim 10, in which the optical phase change profile within the doped medium, induced by the absorbed beam, depends on one or more of:
absolute size and intensity of the absorbed beam and the shaped beam;
relative intensity of the absorbed beam and the shaped beam;
cooling/heating arrangement of the doped medium;
relative size of the absorbed beam and the shaped beam to each other and relative to cooling/heating surfaces of the doped medium;
position of the absorbed and shaped beam relative to each other and relative to the cooling/heating surfaces of the doped medium;
intensity profile of the absorbed beam; and
type of doped medium.

13. The laser beam shaping system as claimed in claim 1, in which the shaped beam is higher power than the absorbed beam.

14. The laser beam shaping system as claimed in claim 13, in which the shaped beam is at least an order or magnitude higher than the absorbed beam.

15. The laser beam shaping system as claimed in claim 1, in which the doped medium is a crystalline medium or a glass medium.

16. The laser beam shaping system as claimed in claim 1, in which:
the doped medium is coated with an Anti-Reflective (AR) layer.

17. The laser beam shaping system as claimed in claim 1, which includes two or more doped media positioned in series.

18. The laser beam shaping system as claimed in claim 17, in which the doped media have different absorption characteristics.

19. The laser beam shaping system as claimed in claim 1, which includes a controller configured to control the absorbed beam input, thereby to control the absorbed beam.

* * * * *